United States Patent [19]
Friend et al.

[11] Patent Number: 5,807,627
[45] Date of Patent: Sep. 15, 1998

[54] ELECTROLUMINESCENT DEVICES

[75] Inventors: Richard Henry Friend; Andrew Bruce Holmes, both of Cambridge; Donal Donat Conor Bradley, Sheffield; Paul Leslie Burn, Oxford, all of United Kingdom; Arno Kraft, Düsseldorf, Germany; Adam Richard Brown, Eindhoven, Netherlands; Jeremy Henley Burroughes; Neil Clement Greenham, both of Cambridge, United Kingdom

[73] Assignee: Cambridge Display Technologies Ltd., Cambridge, United Kingdom

[21] Appl. No.: 848,952

[22] PCT Filed: Jul. 26, 1993

[86] PCT No.: PCT/GB93/01574

§ 371 Date: Mar. 31, 1995

§ 102(e) Date: Mar. 31, 1995

[87] PCT Pub. No.: WO94/03031

PCT Pub. Date: Feb. 3, 1994

Related U.S. Application Data

[63] Continuation of Ser. No. 379,501, Mar. 31, 1995, abandoned.

[30] Foreign Application Priority Data

Jul. 27, 1992 [GB] United Kingdom ............... 9215929

[51] Int. Cl.$^6$ ............... H05B 33/14; B05D 1/38
[52] U.S. Cl. ............... 428/212; 428/690; 428/917; 428/411.1; 428/457; 313/504; 313/506; 257/40; 257/103; 427/66; 427/385.5; 427/402; 427/407.1
[58] Field of Search ............... 428/690, 917, 428/212, 411.1, 457; 313/503, 504, 506; 257/40, 103; 427/66, 384, 385.5, 402, 407.1

[56] References Cited

U.S. PATENT DOCUMENTS 5,283,132  2/1994  Ogura et al. ............... 428/690

FOREIGN PATENT DOCUMENTS

| 0390551 | 10/1990 | European Pat. Off. . |
| 0443861 | 8/1991 | European Pat. Off. . |
| 0553950 | 8/1993 | European Pat. Off. . |
| WO90/13148 | 11/1990 | WIPO . |
| WO92/03490 | 3/1992 | WIPO . |
| WO92/03491 | 3/1995 | WIPO . |

*Primary Examiner*—Marie Yamnitzky
*Attorney, Agent, or Firm*—Merchant, Gould, Smith, Edell, Welter and Schmidt

[57] ABSTRACT

An electroluminescent device has at least two active semiconductive conjugated polymer light emitting layers arranged between a cathode and an anode. The layers are arranged so that at least part of at least two layers lie in an emission zone of the device.

20 Claims, 5 Drawing Sheets

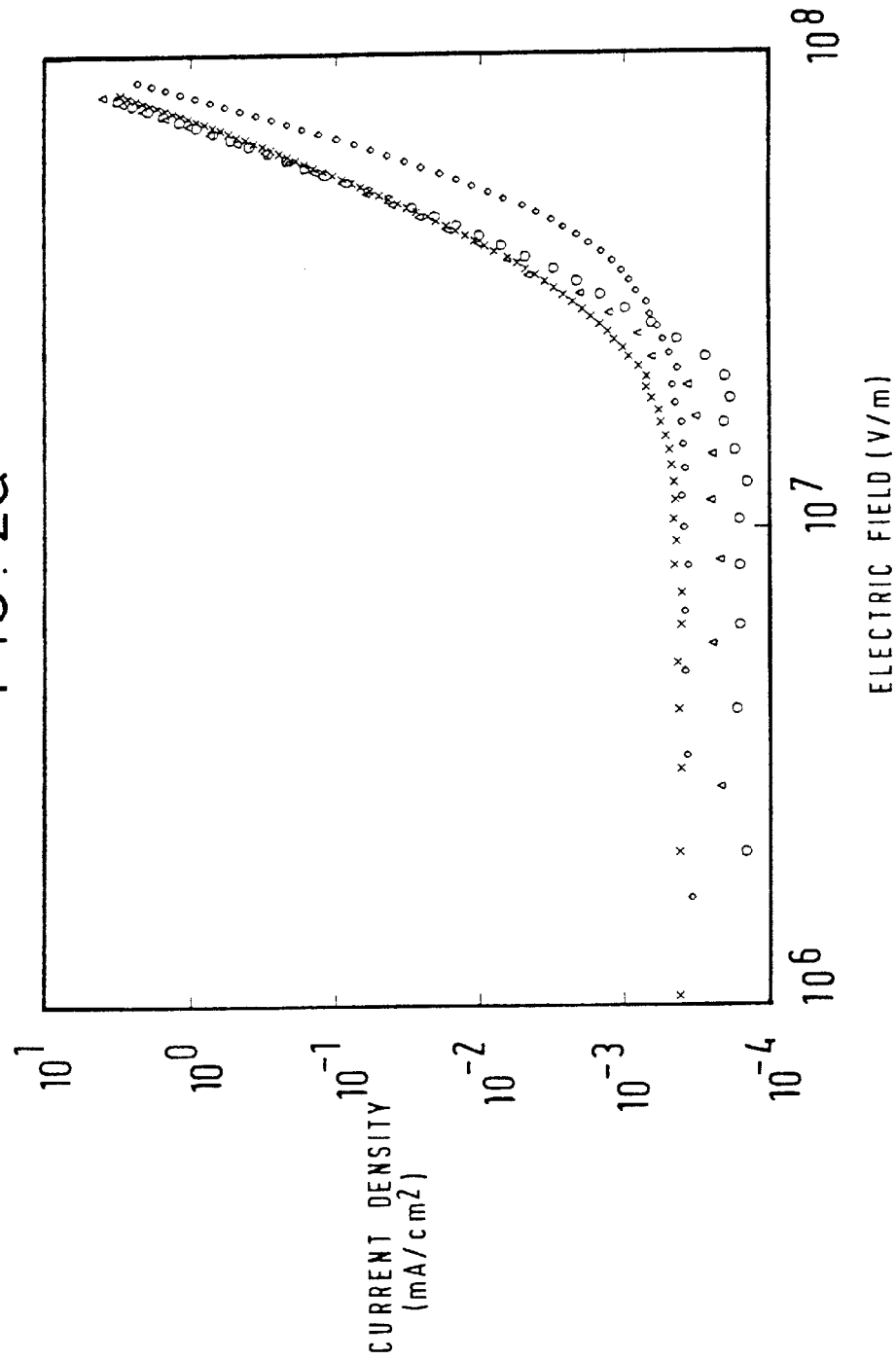

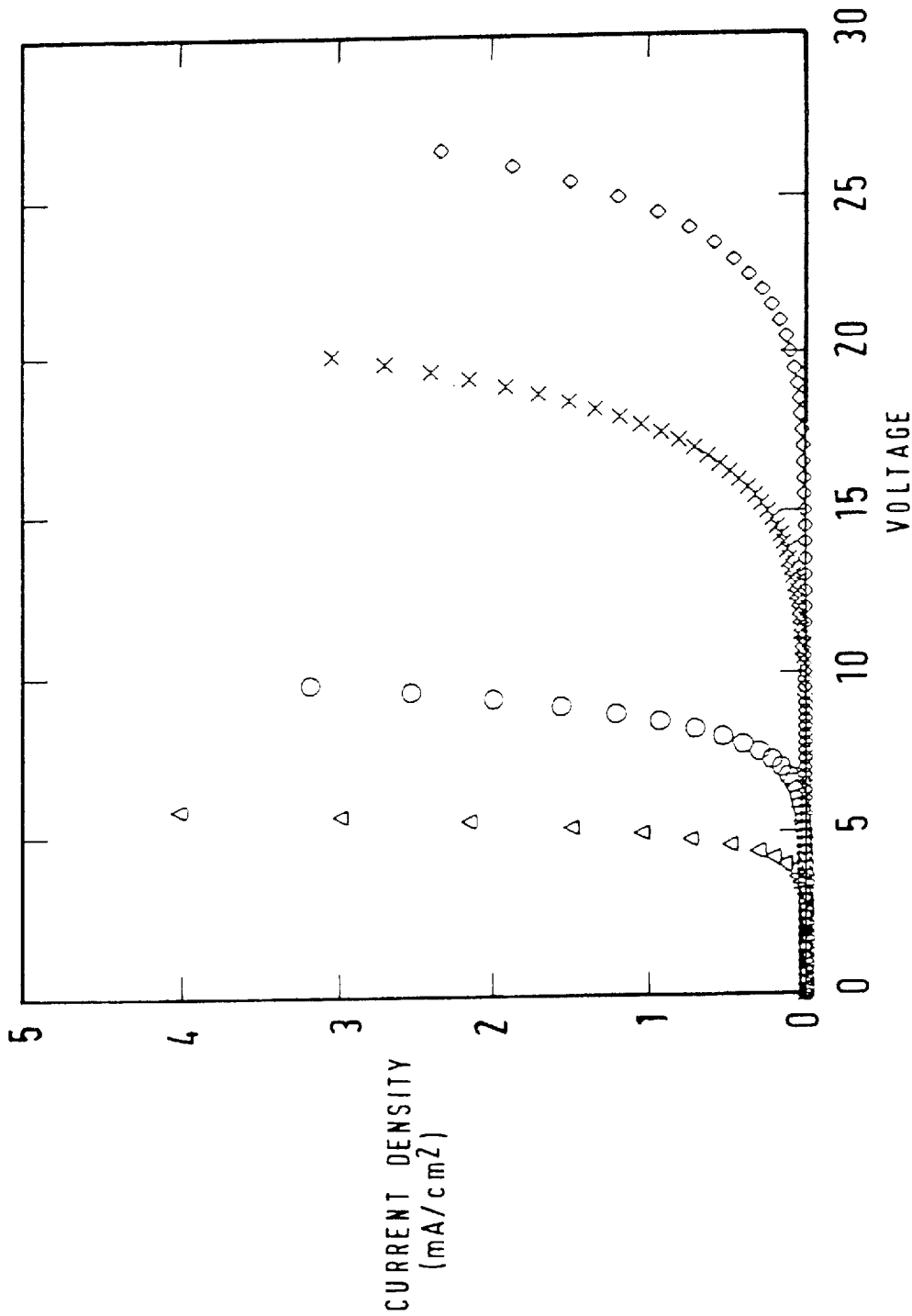

ELECTROLUMINESCENT DEVICES

This is a continuation of application Ser. No. 08/379,501, filed Mar. 31, 1995 and now abandoned, which is a 371 of PCT/GB93/01574.

FIELD OF THE INVENTION

This invention relates to electroluminescent devices and particularly to such devices which have a conjugated polymer as the light emissive layer.

BACKGROUND TO THE INVENTION

Electroluminescent devices of the type with which the present invention is concerned are described for example in PCT/WO90/13148. Reference may also be made to articles by Burroughes et al in Nature (1990) 347,539 and by Braun and Heeger Applied Physics Letters (1991) 58,1982.

These devices offer potential as large-area flat-panel displays since they can be fabricated over large areas using solution-processing techniques. The basic structure of these electroluminescent (EL) devices comprises a polymer film sandwiched between two electrodes, one of which injects electrons, the other of which injects holes.

In the Nature reference the importance of balancing electron and hole injection rates through selection of charge injection electrodes is recognised. For these polymers, it is clear that injection and transport of electrons is less easy to achieve than for holes; this was indicated by the demonstration of improved device efficiencies when low work function metals such as calcium were used as the negative contact layer, as explained in the article in Applied Physics Letters. From photoluminescence studies it has been identified that an important non-radiative decay channel for excitons in these polymers is by exciton diffusion to charged defects which act as quenching sites. Metal injection electrodes can provide many defect states and efficiencies can be raised substantially by introducing an additional layer between the emissive (polymer) layer and the calcium (electrode) layer. For this, a molecular semiconductor, 2-(4-biphenylyl)-5-(4-tert-butylphenyl)-1,3, 4-oxadiazole (butyl PBD) in a poly (methyl methacrylate) PMMA matrix has been used. This layer served both to prevent exciton migration to the metal contact and to enhance electron injection. In this context, reference is made to "Light-Emitting Diodes Based on Conjugated Polymers: Control of Colour and Efficiency", P. L. Burn, A. B. Holmes, A. Kraft, A. R. Brown, D. D. C. Bradley and R. H. Friend, Symposium N, MRS Fall Meeting, Boston Dec. 1991, MRS Symposium Proceedings 247, 647–654 (1992).

As described for example in PCT/WO92/03490, the contents of which are incorporated herein by reference, PPV can be chemically-modified to control its bandgap. For example, poly(2,5-dialkoxyphenylenevinylene) is red-shifted, by some 0.4 eV, with respect to PPV. Copolymers of PPV and poly(2,5-dimethoxy-p-phenylenevinylene), PDMeOPV, allow fine-tuning of the band gap. Furthermore, controlled elimination of precursor leaving-groups allows both red- and blue- shifting of the gap with respect to that for PPV; the latter is achieved by interruption of conjugation along the chain by the presence of non-conjugated groups.

To date therefore it has been possible to have a limited amount of control over the colour of light emitted from an electroluminescent device using conjugated polymers. The present invention seeks to provide an electroluminescent device having a broader range of colour emission.

This has not been achieved in an EL device using conjugated polymer layers and is not a simple matter since the inventors have found that it requires that at least two conjugated polymer layers be put down and be simultaneously excited to emit radiation without one having a detrimental effect on the other.

Reference is made to EP-A-0443861 to Sumitomo which discloses electroluminescent devices made with two layers of conjugated polymers. In this device, only one layer is excited to emit radiation and the other layer is used as a charge transport layer to enhance the transfer of charges into the light emitting layer.

SUMMARY OF THE INVENTION

According to one aspect of the present invention there is provided an electroluminescent device comprising: a first charge carrier injecting layer for injecting positive charge carriers; a first layer of a semiconductive conjugated polymer having a band gap selected such that when it is excited radiation at a first wavelength is emitted; a second layer of a semiconductive conjugated polymer having a band gap selected such that when it is excited radiation at a second wavelength is emitted; a second charge carrier injecting layer for injecting negative charge carriers; and means to enable an electric field to be applied across the said layers wherein at least a part of each of the first and second layers is located in an emission zone of the device, said emission zone extending over a capture region of the device wherein positive and negative charge carriers combine with one another to form excitons and having a width characteristic of the distance over which said excitons migrate before decaying radiatively, such that on application of an electric field to the device both of said first and second polymer layers are caused to emit radiation at their respective wavelengths.

As mentioned above, it is not readily apparent from the work which has already been published in relation to conjugated polymers that it is possible to use a plurality of layers to control the colour of emitted radiation.

The inventors have found that it is possible to define an emission zone in which light is emitted through the radiative decay of excitons. This zone has a width resulting from the capture region of the device where excitons are formed and which is also related to the diffusion characteristic of the excitons. The width of the emission zone can be approximately the same as that of the captive region or it can extend beyond it where the excitons diffuse from it before decaying radiatively. Thus, by ensuring that both the first and second layers have parts lying in this characteristic width, excitons will be present in both the layers and cause emission of radiation from the first and second layers. The effect is quite clearly ascertainable from the experiments discussed herein but there are different theories which could be developed to support the practical observations. One theory discussed herein is that the characteristic diffusion length for an exciton determines the critical width of the emission zone but there are other possibilities. The inventors have thus determined that it is possible to control the properties of a multilayer electroluminescent device by selecting the thicknesses of the polymer layers so that at least two layers have parts in the emission zone. In one aspect, the invention involves the use of several polymer layers with different band gaps, with layer thicknesses selected to be smaller than or comparable to, the width of the emission zone. This results in excitons in two or more layers, and thus to light emission from the two or more layers. This then gives light emission with a broader spectral range than can be achieved with one layer. This (together with a colour filter, if necessary) may allow fabrication of a white light source.

Whatever the theory underlying the observed effect, the experimental evidence is to the effect that the width of the emission zone is of the order of 50 nm. Thus, in the preferred embodiment, the first layer has a thickness which is not greater than 50 nm. Of course, more than two such layers can be provided depending on the required colour of emitted radiation. Generally speaking the emission zone will extend for a width not greater than 200 nm, but this depends on the nature of the polymer layers and charge carrier injection layers.

The location of the emission zone with respect to the charge carrier injection layers depends on the mobilities of electrons and holes within the polymer layers and on the injection functions and can be determined for each particular case using the models discussed later.

In one embodiment there is a third layer of a semiconductive conjugated polymer between said second polymer layer and said second charge carrier injecting layer, the thickness of the third polymer layer being not greater than 50 nm. The emission zone can include part of two layers, part of one layer and a complete other layer or parts of two layers and a complete other layer.

The electroluminescent device can include an additional layer of a conjugated polymer adjacent the second charge carrier injecting layer which is not necessarily electroluminescent but which instead functions as a barrier layer.

Preferably the second charge carrier injecting layer is calcium and the first charge carrier injecting layer is indium-tin oxide coated onto a glass substrate.

The term "conjugated polymer" used herein indicates a polymer for which the main chain is either fully conjugated, possessing extended pi molecular orbitals along the length of the chain, or else is substantially conjugated, but with interruptions to conjugation at various positions, either random or regular, along the main chain. It includes within its scope homopolymers and copolymers. The present invention can utilise any conjugated polymer which is capable of forming a thin electroluminescent film.

Particularly preferred conjugated polymers include poly (p-phenylene vinylene)PPV and copolymers including that polymer. Preferred features of the polymers used with the respective layers are that they should be stable to oxygen, moisture and to exposure to elevated temperatures, they should have good adhesion to an underlying layer, good resistance to thermally-induced and stress-induced cracking, good resistance to shrinkage, swelling, re-crystallisation or other morphological changes. Moreover, the polymer film should be resilient to ion/atomic migration processes, for example by virtue of a high crystallinity and high melting temperature. Particularly preferred polymers are discussed in the literature referred to above, particularly in PCT/WO90/13148 the contents of which are herein incorporated by reference. A particularly suitable polymer is a poly(2,5-dialkoxyphenylenevinylene). Examples are MEHPPV, poly (2-methoxy-5-(2-methylpentyloxy)-1,4-phenylenevinylene), poly(2-methoxy-5-pentyloxy-1,4-phenylenevinylene), and poly(2-methoxy-5-dodecyloxy-1,4-phenylenevinylene), or other poly(2,5-dialkoxyphenylenevinylenes) with at least one of the alkoxy groups being a long solubilising alkoxy group, linear or branched. Other suitable conjugated polymers can also be selected from the poly(alkylthienylene)s. One example is poly(3-dodecylthienylene).

The film of conjugated polymer is preferably a film of a poly(p-phenylenevinylene) [PPV] of formula

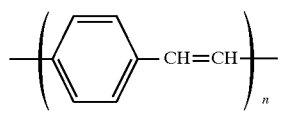

wherein the phenylene ring may optionally carry one or more substituents each independently selected from alkyl (preferably methyl), alkoxy (preferably methoxy or ethoxy) or any other substituent which maintains electroluminescent properties in the conjugated polymer.

Any poly(arylenevinylene) including substituted derivatives thereof or any poly(arylene) is also suitable. Throughout this specification the term "arylene" is intended to include in its scope all types of arylenes including heteroarylenes as well as arylenes incorporating more than one ring structure including fused ring structures.

Other conjugated polymers derived from poly(p-phenylenevinylene) are also suitable for use as the polymer film in the EL devices of the present invention. Typical examples of such derivatives are polymers derived by:

(i) replacing the phenylene ring in formula (I) with a fused ring system, e.g. replacing the phenylene ring with an anthracene or naphthalene ring system to give a structure such as:-

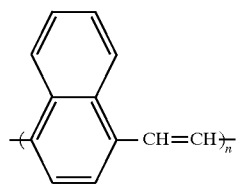

or alternative linkage arrangements which maintain the electroluminescent properties in the conjugated polymer.

These alternative ring systems may also carry one or more substituents of the type described above in relation to the phenylene ring.

(ii) increasing the number of vinylene moieties associated with each phenylene ring (or each of the other alternative ring systems described above in (i) to give structures such as:-

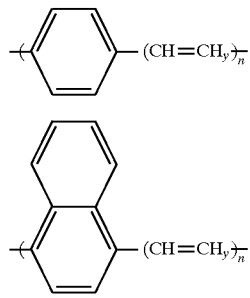

or alternative linkage arrangements which maintain the electroluminescent properties in the conjugated polymer where y represents 2, 3, 4, 5, 6, 7, . . . . .

Once again, the ring systems may carry the various substituents described above.

These various different PPV derivatives will possess different semiconductor energy gaps. The ordering of the layers within the electroluminescent device is affected by the individual bandgaps. The layers should be ordered so that there is no charge trapping at the boundaries between layers.

Other polymers which are particularly suitable for use in the present invention are the semiconductive copolymers discussed in PCT/WO92/03490, the contents of which are herein incorporated by reference. In a preferred embodiment, the copolymer is a conjugated poly (arylenevinylene) copolymer with a proportion of the vinylic groups of the copolymer saturated by the inclusion of a modified group substantially stable to elimination during formation of a film of the copolymer. The proportion of saturated vinylic groups controls the extent of conjugation and thus modulates the semiconductor bandgap of the copolymer.

Preferably polymers for use in the present invention are capable of being processed either as precursors which are subsequently converted to a conjugated form or as intrinsically soluble polymers. In this regard reference is made to PCT/WO90/13148, the contents of which are herein incorporated by reference.

The invention also provides a method of making an electroluminescent device comprising the following steps: providing a first charge carrier injecting layer for injecting positive charge carriers; depositing on said charge carrier injecting layer a first layer of a soluble polymer in a solution of a first solvent and to a first predetermined thickness; depositing a second layer of polymer in the form of a precursor in a solution of a second solvent to a second predetermined thickness; heat treating the device so that the precursor is converted to its polymer which is insoluble; and depositing a second charge carrier injecting layer for injecting negative charge carriers, wherein the first and second predetermined thicknesses are selected so that at least a part of each of the first and second layers is located in an emission zone of the device.

Reference is made to copending Application No. 08/379, 503 filed on 3/31/95 entitled "Manufacture of Electroluminescent Devices" (Page White & Farrer Ref, 74148/VRD), the content of which is incorporated herein by reference.

For a better understanding of the present invention and to show how the same may be carried into effect, reference will now be made by way of example to the accompanying drawings.

BRIEF DESCRIPTION OF THE DRAWINGS

FIG. 2a shows the current density against electric field characteristics of each of four devices on a log-log scale;

FIG. 2b shows current density against voltage on a linear scale;

DESCRIPTION OF THE PREFERRED EMBODIMENT

Figure 1A:
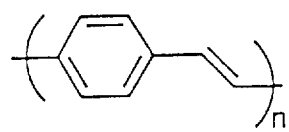
FIGS. 1a, 1b and 1c show the chemical structures of a) PPV, b) a copolymer of PPV and PDMeOPV, c) MEHPPV.

Three different semiconducting poly(arylenevinylene)s are used to demonstrate the invention.
  (a) (FIG. 1a) Poly(p-phenylenevinylene), PPV, was processed from a tetrahydrothiophenium (THT)-leaving precursor polymer which is soluble in methanol, PPV has a $\pi$–$\pi^*$ band gap of about 2.5 eV.
  (b) (FIG. 1b) A copolymer was prepared from a statistical precursor copolymer to PPV and poly(2,5-dimethoxy-p-phenylenevinylene), PDMeOPV, which is soluble in methanol. The monomer feed ratio was 9:1. The synthesis of such a copolymer is described for example in a paper entitled "LEDs based on Conjugated Polymers: Control of Colour and Efficiency" by P. Burn, et al given at MRS Boston 1991 and published in Mat. Res. Soc. Symp. 1992 247, 647–654. Under the experimental conditions used here, the band gap of the polymer obtained after thermal conversion is blue-shifted with respect to PPV due to the presence of non-eliminated methoxy groups at the vinylic carbons adjacent to the dialkoxy-substituted phenylenes. The resulting copolymer has a $\pi$–$\pi^*$ band gap of about 2.6 eV.
  (c) (FIG 1c) The third polymer used was poly(2-methoxy-5-(2-ethylhexloxy)-1,4-phenylenevinylene), MEHPPV. Due to the long alkyl side-groups this derivative of PPV is soluble in and processed from chloroform. It has a $\pi$–$\pi^*$ band gap of about 2.2 eV.

Both the THT-leaving group precursors to PPV and the copolymer are such they can be laid down by spin coating in solution of a solvent, which when dry, forms a stable layer onto which a further layer may be put down. This enables the construction of multilayer structures since, once a layer has dried, subsequent deposition of additional polymer layers will not remove the initial layer. The two THT-leaving group precursor polymers are insoluble in chloroform, but soluble in methanol. MEHPPV is soluble in chloroform, but insoluble in methanol. This difference in solvents allows a layer of precursor to be spin-coated on top of a layer of MEHPPV without removal of the MEHPPV and vice-versa. Hence multilayer structures composed of the three different polymers were fabricated.

The multilayer devices of conjugated polymers were constructed as follows. Indium-tin oxide (ITO)-coated glass substrates were thoroughly cleaned with acetone and subsequently with propan-2-ol, both in an ultrasonic bath. Multilayer structures were formed by spin-coating layers of polymer or precursor, one on top of another as discussed above. All layers were spin-coated within a nitrogen-filled glovebox ($O_2$ and $H_2O$ content 10 ppm), in which all subsequent processing steps were also performed. Film thicknesses of the polymer layers were set by control of both spin-speed and solution concentration as follows: the copolymer at 20 nm, MEHPPV at 50 nm and PPV at more than 50 nm. The thicknesses of the individual polymer layers and total polymer layer were measured with a Dektak IIA surface profiler. The samples were thermally converted at 200° C. in vacuo ($10^{-6}$ torr) for 12 hours to convert the precursor polymers. Calcium contacts were vacuum deposited on the samples and the samples were hermetically sealed. Sample areas were 1 $mm^2$. Four multilayer device structures have been studied here; details of construction are summarised in table 1 and illustrated in FIGS. 3a to 3d.

Figure 3A:
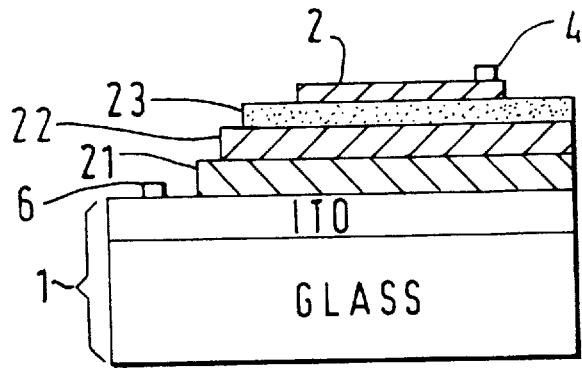
FIGS. 3a to 3d show diagrammatically the structures of four electroluminescent devices I to IV.

To form device I illustrated in FIG. 3a, an indium-tin oxide coated glass substrate 1 was spin coated firstly with a precursor to the copolymer (b) at a thickness of 20 nm (layer 21). The layer was allowed to dry and then a precursor to PPV (a) in the thickness of 230 nm (layer 22) was laid down by spin coating, and allowed to dry. Finally a layer 23 of MEHPPV (c) in the thickness of 50 nm was laid down by spin coating. Layers 21 and 22 were put down in a solution of methanol and layer 23 was put down in a solution of chloroform. The sample was then heat treated to cause thermal conversion of the precursors to the copolymer in layer 21 and to PPV in layer 22. Finally a calcium contact 2 was vacuum deposited on layer 23.

Figure 3B:
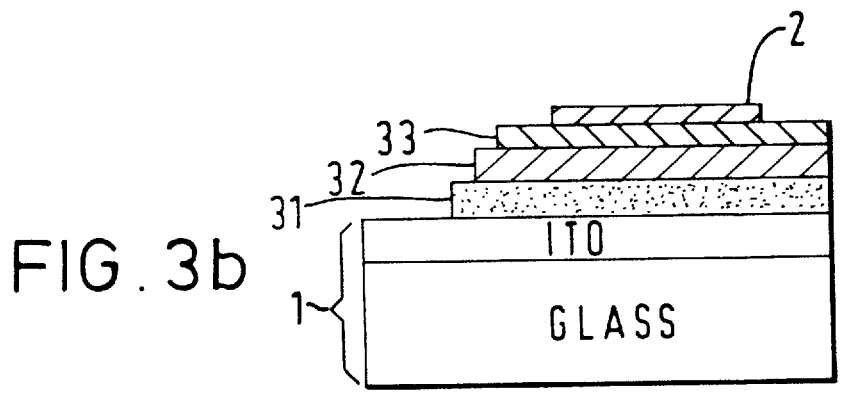

Device II as illustrated in FIG. 3b was formed as follows. Onto an indium-tin oxide coated glass substrate 1 there was spin coated a first layer 31 of MEHPPV in the thickness of 50 nm which was allowed to dry, and then a precursor to PPV 32 in the thickness of 50 nm and allowed to dry. Then a precursor to the copolymer 33 was laid down by spin coating in the thickness of 20 nm. The first layer 31 was put down in a solution of chloroform and the second and third layers 32,33 were put down in a solution of methanol. The device was heat treated to thermally convert the precursors in layers 32 and 33 to the respective polymers PPV and the copolymer and a calcium contact 2 was then vacuum deposited onto layer 33.

Figure 3C:
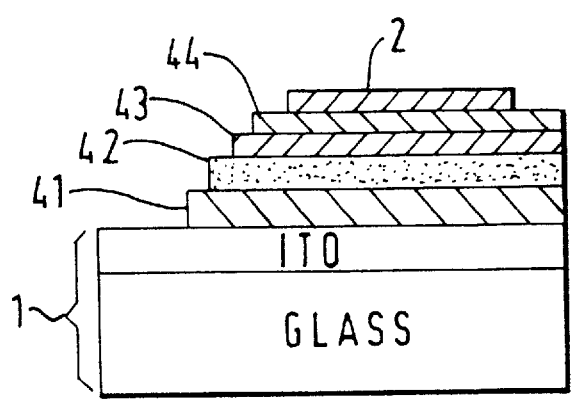

Device III illustrated in FIG. 3c was formed as follows. Onto an indium-tin oxide coated glass substrate 1 was spin coated a first layer 41 of a precursor to the copolymer in a thickness of 20 nm. The precursor was allowed to dry. A second layer 42 of MEHPPV is laid down by spin coating in the thickness of 50 nm and allowed to dry and then a third layer 43 of the precursor to PPV is laid down by spin coating in a thickness of 150 nm. After this layer had dried a fourth layer 44 of a precursor to the copolymer was laid down by spin coating in a thickness of 20 nm. The device was then heat treated to thermally convert the precursors to their respective conjugated polymers and a calcium contact 2 was vacuum deposited onto layer 44.

Figure 3D:
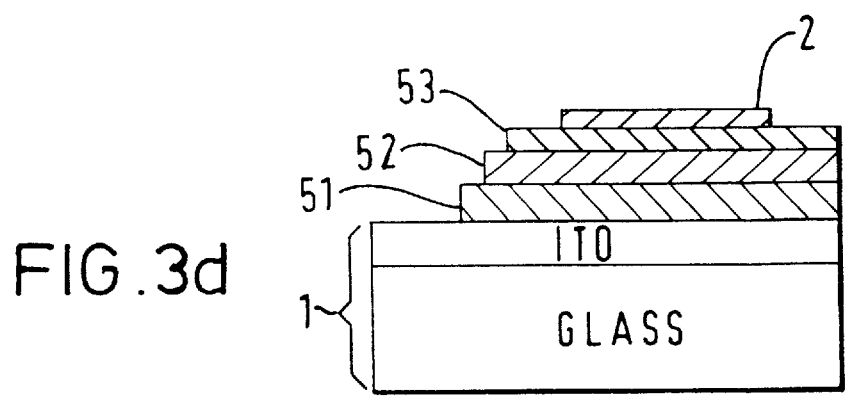

Device IV illustrated in FIG. 3d was formed as follows. Onto an indium-tin oxide coated glass substrate 1 was spin coated a precursor 51 to the copolymer in the thickness of 20 nm. This was then allowed to dry. A precursor to PPV 52 was laid down by spin coating in the thickness of 30 nm and allowed to dry and then a precursor to the copolymer 53 was laid down by spin coating in the thickness of 20 nm. The sample was then heat treated and a calcium contact 2 was vacuum deposited onto the third layer 53.

In these structures, the calcium contact 2 serves as a cathode for injecting negative charge carriers and the indium-tin oxide serves as an anode for injecting positive charge carriers. Reference numeral 4 indicates a negative contact and reference numeral 6 indicates a positive contact.

Figure 1B:
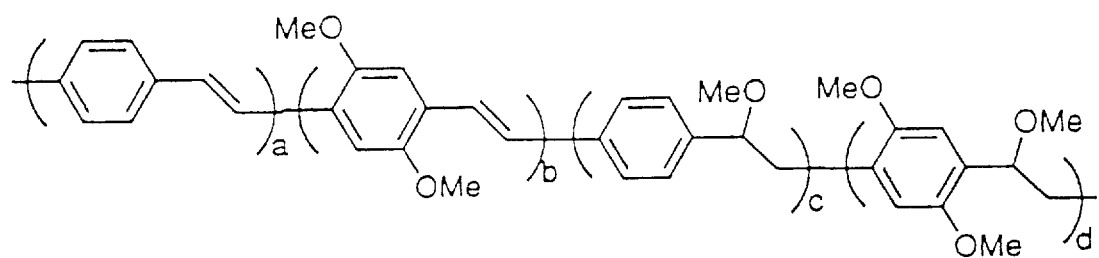
Figure 1C:
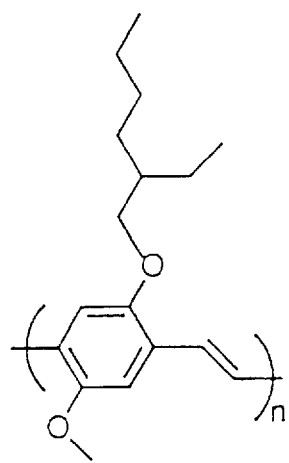

In devices II, III and IV the layer adjacent the calcium contact 2 is a layer of the copolymer which, after heat treatment, is insoluble in common solvents. This layer acts as a barrier layer to shield the cathode from chemical attack, while allowing the injection of charge carrier into the emissive region. This layer of copolymer also serves to resist the diffusion of mobile ions released from the reactive cathode through the polymer layer. It also provides the device with strength, mechanical rigidity and stability at high temperatures. Furthermore, it protects the soluble polymer (MEHPPV) so that the desirable properties of MEHPPV such as the required colour or high efficiency for luminescence can be exploited. Other conjugated polymers or other polymers which can be used as barrier layers instead of that illustrated in FIG. 1b are methoxy-substituted precursor polymers to PPV, dimethoxy-PPV, dimethyl-PPV, polyaniline and derivatives, polyvinylcarbazole, blends of dimethyl-PPV and any other higher band gap polymers.

As explained above, the indium-tin oxide coated glass substrate serves as an anode for the device while the calcium contact 2 serves as a cathode. These constitute means for enabling an electric field to be applied across the layers.

The devices were driven by applying a positive bias to the ITO with a Keithley 230 voltage source and electric currents were monitored with a Keithley 195A multimeter. Electroluminescence (EL) was observed through the ITO substrate. Integrated light output was monitored with a large-area calibrated silicon photodiode in photoamperic mode, measuring the photocurrent as a voltage across a 1 MΩ resistor. Spectrally-resolved EL measurements were made using a Coderg PH1 double monochromator and a Hamamatsu R943-02 photomultiplier tube. Internal quantum efficiencies, defined here as photons generated per injected charge, were measured at a device brightness of about 5 $cd/m^2$. In calculating the internal quantum efficiency account has been taken of the effects of refraction by the glass substrate, as discussed in an article in the 1992 issue of Synthetic Metals authored by Brown, et al. UV/vis absorption spectra were recorded with a Perkin Elmer λ9 spectrophotometer on samples of polymer spin-coated on silica substrates.

Figure 4:
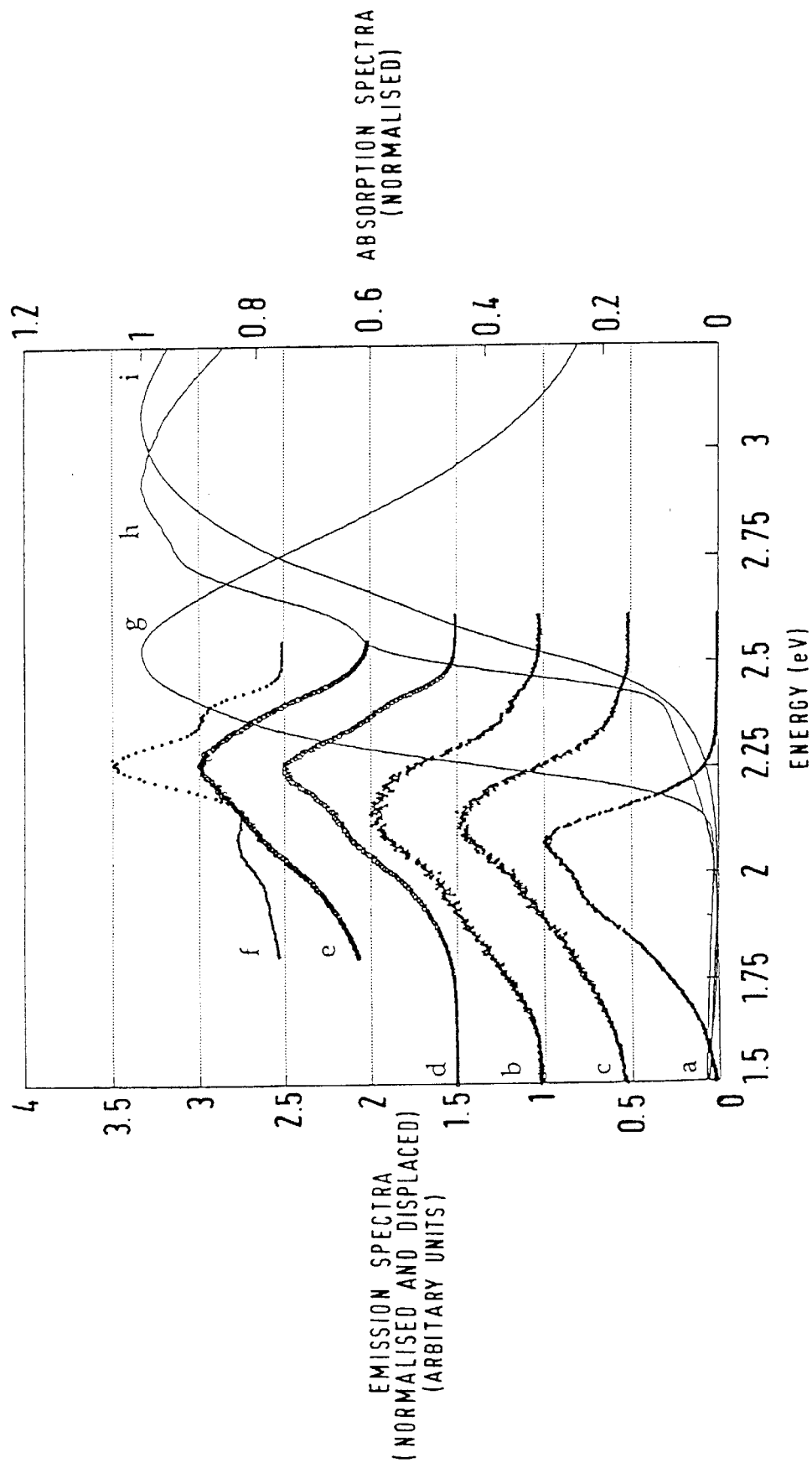
FIG. 4 shows the electroluminescent emission spectra (all normalised to a peak emission of 1 and offset) of (a) sample I, (b) sample II, (c) sample III, (d) sample IV, (e) a unilayer copolymer electroluminescent device, (f) a unilayer PPV electroluminescent device, (g) to (i) the absorption spectra of the polymers a, b, and c themselves. Curve g corresponds to polymer c) MEHPPV; curve h corresponds to polymer a) PPV and curve i corresponds to copolymer b).

The four device configurations show colours of emission from red to yellow/green. Electrical and electro-optical characteristics for these devices are shown in Table 1, and in FIGS. 2a, 2b and 4. In Table V, the layers are denoted in numerical order from the ITO content 1. In FIGS. 2a and 2b note that different thicknesses of the combined polymer layers give different drive voltages, but that these scale to give a universal curve for current density versus electric field. FIG. 2b shows the current density against electric field voltage characteristics of the four devices. FIG. 4 shows the emission spectra from the various devices (the spectra are offset and normalised to give equal peak heights at the peak emission wavelengths). Also displayed are emission spectra from unilayer devices of PPV and the copolymer. The absorption spectra of the 3 polymers are also shown (curves g,h,i) (normalised to give a peak π–π* absorption coefficient of 1), showing the differing optical band gaps.

FIGS. 2a and 2b show clearly that the current density under forward bias is determined primarily by the electric field (calculated as the applied voltage divided by the sum of the individual layer thicknesses). In contrast to the results obtained for the devices formed with PPV and the butyl PBD/PMMA layers (discussed in the reference referred to above by P. L. Burn et al), the devices studied here do not show a large build-up of space charge at the interfaces between polymer layers. Also, the small differences in band gap for the polymers in contact with the metal electrode layers do not affect significantly the threshold fields for charge injection.

The various structures give a range of different emission colours, and by analysing these it can be identified which of the polymer layers are acting as sites for radiative decay of excitons:

Structure I was the only structure to show an emission spectrum characteristic of a single polymer layer, in this case MEHPPV. There is no contribution to the emission spectrum from excitons decaying in the PPV or copolymer layers, since at energies about 2.35 eV there is no emission, whereas the emission spectra of PPV and copolymer both have strong emission intensities at 2.35 eV. Probably therefore electron injection is the limiting process in the devices, so that electron and holes meet in a recombination zone adjacent to the electron-injecting calcium contact 2. It is unfavourable for the excitons formed in the MEHPPV layer to migrate into the other polymer layers which have larger band gaps. By the same argument, the absence of any contribution to the emission spectra from the PPV layer indicates that no electron-hole capture occurs in this layer and thus that no electrons migrate into the PPV layer through the MEHPPV layer, under the influence of the electric field. The copolymer and PPV layers are acting as hole transport layers. The emission spectra also demonstrate that, surprisingly, the thermal conversion process does not damage or alter the MEHPPV.

Structure II has the same combination of polymer layers as structure I but constructed the other way up. The emission spectrum of the device is broad with emission stretching from below 1.55 eV to above 2.5 eV. At 1.75 eV, both PPV and copolymer have negligible emission yet the emission of sample II is still more than 15% of the peak emission and must be due to the radiative decay of excitons located in the MEHPPV layer. Similarly, at 2.35 eV MEHPPV has zero emission, yet the emission of sample II is still more than 30% of the peak emission for the sample and so the emission at this energy must be due to the decay of excitons located in either the copolymer or PPV layers. This device is thus clearly an example of a conjugated polymer device emitting from more than one polymer layer. The nature of the generation of the excitons in the various polymer layers will be discussed later.

Structure III has an emission spectrum very similar to that for structure II. Thus the emission of this device, for the same reasons as discussed above, has contributions from the decay of excitons located in the MEHPPV layer and at least one of either the PPV or the copolymer layers. It appears the additional copolymer layer has negligible effect on the emission spectrum, and one might deduce that no excitons indeed are located in this additional copolymer layer adjacent to the ITO. This device also is an example where exciton decay occurs within the bulk of a polymer multilayer device as the MEHPPV is separated from both contacts by other layers.

Structure IV has an emission spectrum with contributions from both the PPV layer and the copolymer layer. The emission spectrum shows phonon structure at 2.07, 2.26 and 2.39 eV which is less pronounced than that for PPV, though clearer than in the copolymer.

These devices operate by electron and hole injection at negative and positive electrodes, with electron-hole capture to form excitons, which can then decay radiatively. There are no large changes in the current density-electric field characteristics accompanying the introduction of several layers of polymer, so there is probably little or no charge confinement resulting in space charge build-up at the interfaces between these layers. Thus there is little modification of the internal electric field and the conditions for charge injection and charge migration are not much affected by the presence of several layers of polymer with similar band gaps.

In structures II–IV emission in several polymer layers can be observed with an emission zone more than 50 nm in total thickness. It is of interest to identify the mobile species which gives rise to this wide emission zone. The two candidate mobile species are (i) charge carriers and (ii) neutral excitons. Depending on the behaviour of these charged and neutral species, we can expect to see behaviour ranging from the limit where a broad electron-hole capture zone is narrow, but in which exciton diffusion acts to produce a broad emission zone.

Thus, the precise thicknesses and arrangement of the layers of conjugated polymer within an electroluminescent device can be ascertained from a knowledge of the polymer band gap, electron-hole mobilities in the polymer, and a value for the exciton diffusion lifetime with reference to the models discussed herein. Firstly these cases are outlined by two simple models to give estimates of the widths produced by the two mechanisms.

(i) Width of electron-hole capture zone.

Let us consider that electron hole capture is mediated by Coulombic attraction and will occur within a sphere of radius, $r_{capture}$, where this attraction exceeds the thermal energy. Then $$kT = \frac{e^2}{4\pi\epsilon_0\epsilon_r r_{capture}}$$

$$\ldots r_{capture} \leq \frac{e^2}{4\pi\epsilon_0\epsilon_r kT}$$

Taking a value for the relative permittivity $\epsilon_r$ of about 4, we have at room temperature $r_{capture} \approx 14$ nm. It can be demonstrated from simple models for the drift of charges through the device that, in the absence of barriers for carrier transport at interfaces, the space charge densities of positive and negative charge carriers are low, and that the width of the electron-hole capture zone can be modelled to lie in the range of the polymer layer thicknesses used for example II to IV. At an electric field, F, with a current density, j, and a carrier mobility, $\mu$, the carrier density, p is given by $$p = j/ev = j/eF\mu$$

Taking typical device operation values of $j=1$ mA/cm$^2$, and $F=10^8$ V/m and assuming a mobility, $\mu \sim 10^{-4}$ cm$^2$/V sec, as has been observed in similar conjugated polymers for the majority, p-type carriers gives a carrier density, $p=6.2 \times 10^{20}$ m$^{-3}$. This gives a carrier-carrier separation of about 120 nm.

If electrons have a mobility, $\mu_n$, the number of collisions an electron undergoes in time, t, is $tF(\mu_n+\mu_p)p\sigma$ where $\sigma$ is the collision cross-section. Assuming every collision results in capture, we can then estimate an electron-hole capture zone width, $W_{e-h}$ given by $$W_{e-h} = \frac{\mu_n}{(\mu_n+\mu_p)p\sigma} = \frac{\mu_n\mu_p eF}{(\mu_n+\mu_p)j\sigma} \approx \frac{\mu_n}{(\mu_n+\mu_p)pr_{capture}^2}$$

Using the values here, based on the hole mobilities estimated above, and assuming equal electron and hole mobilities, we find a value of $W_{e-h} \approx 4000$ nm. This width is very much larger than we find here, and we consider that confinement to much smaller thicknesses near the cathode results from a much lower electron mobility.

(ii) Exciton diffusion length.

We may assume a simple exciton diffusion equation, with a characteristic variance of the displacement from the origin, $1^2 \sim D\tau$. Exciton lifetimes, $\tau$, of above 0.25 ns have been measured in PPV. Typical values of the magnitude of diffusion coefficients, D, in molecular semiconductors are of the order $1 \times 10^{-3}$ cm$^2$s$^{-1}$ and the coefficient in these conjugated polymers does not exceed this. These values then give an estimate of the diffusion length of an exciton, $1, \sim 5$ nm.

Although the multilayer emission is observed only in structures II–IV, it is constructive to consider an analysis of structure I first. As the emission spectrum of structure I is characteristic of the single polymer layer of MEHPPV, the recombination zone is probably confined within the 50 nm thickness of the MEHPPV layer. From the above analysis, such a zone thickness would only be consistent with electron-hole capture by a Coulomb interaction if the electron mobility is less than $10^{-6}$ cm$^2$/V sec. This may be the case, since minority carrier mobilities in organic semiconductors are often significantly smaller than those of the majority carriers. Another explanation is that there is a barrier against electron migration from the MEHPPV layer into the PPV layer and so confining the recombination zone to the MEHPPV layer.

As has already been indicated, in structures II–IV the spectral shifts indicate that emission occurs in layers not solely adjacent to the calcium contact. In the scenario in which the width of the emissive layer is determined by the width of the electron-hole capture zone, there is no barrier against electron migration in all these structures since electrons pass from PPV into MEHPPV. The electron-hole capture zone then extends through several polymer layers and over more than 200 nm in structure III. Excitons are then formed in several different polymer layers and then radiatively decay in several polymer layers, given the observed emission spectra. Thus, in structure I the recombination zone is within 50 nm of the electron-injecting contact, observing emission from only one layer. The recombination zone is probably limited in this structure due to a barrier against electron migration out of the MEHPPV layer.

Though the inventors consider that the width of the characteristic emissive zone in these EL devices is in part determined by the statistics for electron-hole capture, there are other possible explanations. One such is that the recombination could be occurring within a 50 nm zone adjacent to the calcium contact (as in structure I) and that there is subsequent exciton transfer from the recombination zone to different emission zones. This transfer could occur by several mechanisms. Firstly, there may be absorption and re-emission at a longer wavelength, but this is not significant for the devices studied here. One reason for this is that one would expect to see a concomitant fall-off in device efficiency, given that luminescence yields are not 100%. Experimentally, there is little variation in efficiency from one device to another, as summarised in table 1.

Secondly, there may be exciton diffusion from one layer to another. The radiative lifetimes for singlet excitons in PPV are of the order of 1 nsec. Measured photoluminescence lifetimes are lower, indicating that there are competing non-radiative decay mechanisms, but lifetimes are 250 psecs or longer at room temperature, and this allows for diffusion of the exciton through the polymer prior to decay. Evidence for migration of excitons, created by photoexcitation, within a film of PPV, is provided by comparison of absorption and photoluminescence spectra. Even in polymer samples that show a considerable spread in intra-chain conjugation length, and hence band gap, such that the phonon structure expected in the absorption spectrum is washed out, the luminescence spectra show clear vibronic structure, indicating that the excitons so formed, prior to emission, have migrated to the chain segments with longest uninterrupted conjugation length and hence with lower band gap. Exciton diffusion is very well studied in molecular semiconductors and under the conditions in these conjugated polymer films may occur either by direct hopping or by Förster transfer. Energy transfer to a chromophore with a longer wavelength of emission, which can be selectively introduced as a dopant in the semiconductor, is a well-studied phenomenon.

A further example of the invention is discussed below. A different soluble conjugated polymer is used in place of the MEH-PPV. The polymer used is poly(3-dodecylthienylene), P3DT, for which the chemical structure is

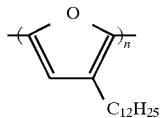

This polymer is soluble by virtue of the dodecyl sidechain, and is processed from solution, in for example, chloroform. It shows good photoluminescence and has been shown to function in an electroluminescent device.

A device was fabricated in a similar manner to Example II, with a layer of P3DT (thickness 500 nm) on the ITO contact 1, and a layer of PPV precursor spin-coated on top to a thickness of 100 nm and subsequently heated to convert to PPV (200° C., 12 hours) in place of the two precursor-route layers in Example II. Calcium was evaporated onto this as a final stage.

While these particular thicknesses were found to be successful, it is desirable to have a thickness of less than 500 nm for P3DT. This is acceptable provided that at least part of both of the layers lie in the emission zone of the device.

This device shows a high threshold voltage for charge injection, requiring 80 V or more to give readily visible emission. This high drive voltage is due to the considerable thickness of the P3DT layer. The quantum efficiency for this device was found to be about 0.08%.

The light output was observed by eye to be deep red, characteristic of the luminescence of P3DT which is considerably to the red of PPV. Emission from the PPV layer viewed through the P3DT layer and the ITO/glass substrate would be strongly attenuated by the absorption of the PPV emission by the P3DT (the PPV emission falls in the absorption band of P3DT since this has a lower band gap).

This device demonstrates various points:
  (i) Emission is produced in a layer not immediately adjacent to the cathode. It can reasonably be expected that emission was also observed from the PPV layer, (c.f Example II). This is therefore another example of a multilayer emitting device, but should optimally be modified so that the polymer layer thicknesses avoid the problem of absorption by one layer of the light produced by another.
  (ii) Furthermore, it is a device where a layer of precursor polymer has successfully been laid down onto a soluble polymer layer, taking advantage of the different solubilities of the polymers, and where the structure survives the thermal treatment required to convert to the conjugated form.

Industrial Application

In summary, the inventors have discovered that multilayer electroluminescent devices with emission from more than one layer can be fabricated. Such multilayer structures could be used to control device characteristics in a range of applications. For example at least two polymer layers can be arranged to be simultaneously luminescing. This will allow generation of a broader spectrum than can be achieved with a single layer (see structures II, III and IV), and may allow fabrication of a white-light source.

A particularly important discovery is that the region of the device in which the emission occurs can be arranged to be sufficiently wide so that several polymer layers can simultaneously emit. The probable reasons for this are firstly, that in the absence of charge trapping at an interface between two polymer layers, the electron-hole capture process requires thicknesses of polymer of at least 50 nanometers so that excitons are formed in the region of this thickness. Secondly, excitons once formed will diffuse before they decay and this process of diffusion can further broaden the width of the emission zone. The inventors have determined that for optimum performance the device should be manufactured so as to take into account the following points. As is evident from the examples, the emission is usually to be seen from the region of the polymer adjacent the cathode. This indicates that either electron injection is more difficult than hole injection and/or that electrons have lower mobility than holes. Emission from more than one layer is therefore more likely to be achieved in devices where appropriate layers are deposited close to the cathode. Another determinative feature is the band gap of the polymer layers. Inappropriate ordering of the polymer layers can result in complete trapping of excitons within one layer only as seen in Example 1 in which there is a low band gap polymer (MEHPPV) adjacent the cathode. Thus, preferably, the band gaps are ordered to assist charge carrier transfer and capture.

TABLE 1

| Sample Number | I | II | III | IV |
|---|---|---|---|---|
| Layer 1 | copolymer | MEHPPV | copolymer | copolymer |
| thickness (nm) | 20 | 50 | 20 | 20 |
| Layer 2 | PPV | PPV | MEHPPV | PPV |
| thickness (nm) | 230 | 50 | 50 | 30 |
| Layer 3 | MEHPPV | copolymer | PPV | copolymer |
| thickness (nm) | 50 | 20 | 150 | 20 |
| Layer 4 | | | copolymer | |
| thickness (nm) | | | 20 | |
| Colour of light emission | red | orange | orange | yellow |
| Quantum efficiency, η (%) | 0.30 | 0.22 | 0.24 | 0.16 |
| Electric field (V/cm) required to produce: | | | | |
| 1 mA cm$^{-2}$ | $8.0 \times 10^5$ | $7.1 \times 10^5$ | $7.4 \times 10^5$ | $7.1 \times 10^5$ |
| 2 mA cm$^{-2}$ | $8.6 \times 10^5$ | $7.7 \times 10^5$ | $7.9 \times 10^5$ | $7.7 \times 10^5$ |

Characteristics of the four multilayer electroluminescent devices. Polymer layer 1 was spin-coated directly on top of the ITO contact. The calcium contact was evaporated on top of polymer layer 3 (or polymer layer 4 in the case of device III).

We claim:

1. An electroluminescent device comprising:
   a first charge carrier injecting layer for injecting positive charge carriers;
   a first layer of a semiconductive conjugated polymer having a band gap selected such that when it is excited radiation at a first wavelength is emitted;
   a second layer of a semiconductive conjugated polymer having a band gap selected such that when it is excited radiation at a second wavelength is emitted;
   a second charge carrier injecting layer for injecting negative charge carriers; and
   means to enable an electric field to be applied across the said layers wherein at least a part of each of the first and second semiconductive conjugated polymer layers is located in an emission zone of the device, the difference between the band gap of the first and second semiconductive conjugated polymer layers being sufficiently small that it does not permit a large build-up of space-charge at an interface between the polymer layers, whereby said emission zone extends for a distance of at least 50 nm over a capture region of the device wherein positive and negative charge carriers combine with one another to form excitons and has a width characteristic of the distance over which said excitons migrate before decaying radiatively, such that on application of an electric field to the device both of said first and second polymer layers are caused to emit radiation at their respective wavelengths.

2. An electroluminescent device as claimed in claim 1 wherein the width of the emission zone is not greater than 200 nm.

3. An electroluminescent device as claimed in claim 1 wherein the first semiconductive conjugated polymer layer has a thickness which is not greater than 50 nm.

4. An electroluminescent device as claimed in claim 1 wherein there is a third layer of a semiconductive conjugated polymer between said second semiconductive conjugated polymer layer and said second charge carrier injecting layer.

5. An electroluminescent device as claimed in claim 4 wherein the third layer has a thickness not greater than 50 nm.

6. An electroluminescent device as claimed in claim 4 wherein the third layer constitutes a barrier layer between the second charge carrier injecting layer and the second semiconductive conjugated polymer layer.

7. An electroluminescent device as claimed in claim 6 wherein the third layer is light emissive.

8. An electroluminescent device as claimed in claim 7 wherein there is a further semiconductive conjugated polymer layer between the first semiconductive conjugated polymer layer and the first charge carrier injecting layer.

9. An electroluminescent device as claimed in claim 8 wherein the second charge carrier injecting layer is calcium.

10. An electroluminescent device as claimed in claim 9 wherein the first charge carrier injecting layer is indium tin oxide.

11. An electroluminescent device as claimed in claim 8 wherein the semiconductive conjugated polymers forming any one of the first, second, third and further layers is selected from the group consisting of poly(p-phenylene vinylene); substituted derivatives of poly(p-phenylene vinylene); and copolymers including poly(p-phenylene vinylene).

12. An electroluminescent device as claimed in claim 11 wherein the copolymer is a conjugated poly(arylene vinylene) copolymer with a proportion of the vinylic groups of the copolymer saturated by the inclusion of a modifier group stable to elimination during formation of a film of the copolymer.

13. An electroluminescent device as claimed in claim 4 wherein the third layer is a copolymer of PPV and PDMeOPV.

14. An electroluminescent device as claimed in claim 1 wherein the first semiconductive conjugated polymer layer is a poly(2,5-dialkoxyphenylene-vinylene) selected from the group consisting of MEHPPV, poly(2-methoxy-5-(2-methylpentyloxy)-1,4-phenylenevinylene); poly(2-methoxy-5-pentyloxy-1,4-phenylene-vinylene); and poly(2-methoxy-5-dodecyloxy-1,4-phenylenevinylene).

15. An electroluminescent device as claimed in claim 1 wherein the first semiconductive conjugated polymer layer is a poly(alkylthienylene).

16. An electroluminescent device as claimed in claim 1 wherein the first semiconductive conjugated polymer layer is a layer of MEHPPV having a thickness of about 50 nm and the second semiconductive conjugated polymer layer is PPV having a thickness of less than 200 nm.

17. An electroluminescent device as claimed in claim 16 which includes a barrier layer having a thickness of about 20 nm between the second semiconductive conjugated polymer layer and the second charge carrier injecting layer.

18. An electroluminescent device as claimed in claim 1 wherein the first semiconductive conjugated polymer layer is a layer of P3DT having a thickness of about 500 nm and the second semiconductive conjugated polymer layer is PPV having a thickness of about 100 nm.

19. An electroluminescent device as claimed in claim 1 wherein the second polymer layer is PPV of formula

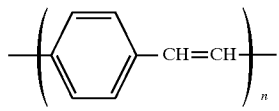

where n indicates degree of polymerization.

20. A method of making an electroluminescent device comprising the following steps:

providing a first charge carrier injecting layer for injecting positive charge carriers;

depositing on said charge carrier injecting layer a first layer of a soluble polymer in a solution of a first solvent and to a first predetermined thickness;

drying said first layer;

depositing on said first layer a second layer of a polymer to a second predetermined thickness, said second layer of polymer being deposited in the form of a precursor in a solution of a second solvent which is different than the first solvent, the first layer of polymer being insoluble in the second solvent;

drying said second layer;

heat treating the device so that the precursor is converted to its polymer;

depositing a second charge carrier injecting layer for injecting negative charge carriers;

wherein the polymer of the first layer emits radiation at a first wavelength when it is excited, and the polymer of the second layer emits radiation at a second wavelength when it is excited; and wherein the first and second predetermined thicknesses are selected so that at least a part of each of the first and second polymer layers is located in an emission zone of the device.

* * * * *

UNITED STATES PATENT AND TRADEMARK OFFICE
CERTIFICATE OF CORRECTION

PATENT NO. : 5,807,627

DATED : SEPTEMBER 15, 1998

INVENTOR(S) : FRIEND ET AL.

It is certified that error appears in the above-identified patent and that said Letters Patent is hereby corrected as shown below:

Col. 10, line 38: in the equation, "$pr^2_{capture}$" should read —$pr_{capture}^2$—

Col. 12, line 4: in the chemical drawing, "O" should read —S—

Signed and Sealed this

Second Day of May, 2000

Q. TODD DICKINSON

*Attest:*

*Attesting Officer*     *Director of Patents and Trademarks*